United States Patent
Ohashi et al.

(10) Patent No.: US 7,955,948 B2
(45) Date of Patent: Jun. 7, 2011

(54) MANUFACTURING METHOD OF SEMICONDUCTOR DEVICE

(75) Inventors: Naofumi Ohashi, Tokyo (JP); Yuichi Wada, Toyama (JP); Nobuo Owada, Tokyo (JP); Takeshi Taniguchi, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 77 days.

(21) Appl. No.: 12/551,816

(22) Filed: Sep. 1, 2009

(65) Prior Publication Data
US 2010/0055926 A1 Mar. 4, 2010

(30) Foreign Application Priority Data

| | | |
|---|---|---|
| Sep. 3, 2008 | (JP) | 2008-226323 |
| Sep. 3, 2008 | (JP) | 2008-226324 |
| Sep. 3, 2008 | (JP) | 2008-226325 |
| Sep. 3, 2008 | (JP) | 2008-226326 |
| Jul. 23, 2009 | (JP) | 2009-172004 |

(51) Int. Cl.
H01L 21/76 (2006.01)
H01L 21/469 (2006.01)
(52) U.S. Cl. .. 438/424; 438/787; 438/788; 257/E21.278
(58) Field of Classification Search .......... 438/424, 438/787, 788; 257/E21.278
See application file for complete search history.

(56) References Cited

U.S. PATENT DOCUMENTS

| | | | | |
|---|---|---|---|---|
| 6,649,495 | B2 * | 11/2003 | Shioya et al. | 438/485 |
| 7,064,084 | B2 * | 6/2006 | Hishiya et al. | 438/770 |
| 7,335,609 | B2 * | 2/2008 | Ingle et al. | 438/787 |
| 7,763,522 | B2 * | 7/2010 | Su | 438/424 |
| 2010/0190317 | A1 * | 7/2010 | Iwasawa et al. | 438/423 |

FOREIGN PATENT DOCUMENTS
JP 2-94430 A 4/1990
JP 2002-075988 A 3/2002

OTHER PUBLICATIONS

Japanese Office Action issued on Sep. 14, 2010, in counterpart Japanese Application No. 2009-172004 (8 pages, in Japanese, including complete English translation).
Japanese Office Action issued on Dec. 28, 2010, in counterpart Japanese Application No. 2009-172004 (5 pages, including complete English translation).

* cited by examiner

Primary Examiner — Tuan N. Quach
(74) Attorney, Agent, or Firm — Randall S. Svihla

(57) ABSTRACT

A manufacturing method of a semiconductor device includes the steps of carrying a substrate in a processing chamber, bringing the processing chamber into a state at a first pressure by supplying a silicon compound gas which contains carbon and hydrogen into the processing chamber, forming a silicon oxide film on the substrate by irradiating a UV light to the silicon compound gas supplied into the processing chamber in the state kept at the first pressure, and decompression process to bring the processing chamber into a state at a second pressure lower than the first pressure. This makes it possible to form the dense silicon oxide film in the trench with high aspect ratio and small width.

12 Claims, 7 Drawing Sheets

MANUFACTURING METHOD OF SEMICONDUCTOR DEVICE

BACKGROUND OF THE INVENTION

1. Field of the Invention

The present invention relates to a substrate processing technology using the ultraviolet (UV) light, and more particularly, it relates to a method and an apparatus of manufacturing a semiconductor device, which are effective for depositing an oxide film and the like to be formed on a semiconductor substrate (for example, semiconductor wafer) from which a semiconductor integrated circuit (hereinafter referred to as IC) is fabricated.

2. Description of the Related Art

Accompanied with the trend of a highly integrated IC, the circuit element which constitutes the IC such as the transistor has been demanded to be further miniaturized. Currently, the STI (Shallow Trench Isolation) method which is excellent in the dimension control and occupies less space has been employed as the IC element isolation forming method. The STI method is used for forming the element isolation region by filling the insulating film in the trench formed in the semiconductor substrate through normal pressure CVD (Chemical Vapor Deposition) method using TEOS (tetra-ethoxysilane) and $O_3$ (ozone), and the plasma CVD method using TEOS.

Recently, the width of the element isolation trench has become 0.1 μm or less to satisfy the recent demand of higher IC integration, and the aspect ratio (trench depth/trench width), that is, the ratio of the depth to the width of the element isolation trench has been increased. It is difficult for the generally employed normal pressure CVD method to fill the insulating film in the element isolation trench without forming the void nor the seam as described later.

One of the reasons for the aforementioned difficulty is that in the generally employed normal pressure CVD method, the rate for forming the insulating film in the opening of the trench is higher than the rate for forming the film to the depth (on the bottom) of the trench. As the film forming rate in the opening of the trench is higher than the one on the bottom portion, the opening may be sealed with the insulating film before the insulating film is sufficiently filled onto the bottom of the trench. In this way, the phenomenon that the thickness of the film formed in the opening becomes larger than that of the film formed on the bottom of the trench may be called as "over-hang".

The reason why the rate for forming the insulating film in the opening of the trench is higher than the one for forming the film on the bottom will be described as below. In the generally employed normal pressure CVD method and the plasma CVD method, the material gas is decomposed by the heat and the like, and the chemical reaction occurs in the gas phase to cause the reaction product to adhere to the substrate, thus forming the insulating film. As a result, the film forming rate is limited by the speed for supplying the material gas, the reaction speed of the material gas in the gas phase, the sticking probability of the reaction product to the substrate and the like.

Under the supply limit condition where the sticking probability of the reaction product to the substrate is close to 1, the rate for forming the insulating film in the opening of the trench is higher than the film forming rate on the bottom of the trench. In this case, the opening of the trench is sealed with the insulating film before it is sufficiently filled onto the bottom of the trench to form such air gap as void. Under the reaction limit condition where the sticking probability of the reaction product to the substrate is close to 0, the insulating film grows on the side walls at both sides of the trench, thus generating the slit-like defect called seam at the joint between the insulating films at both sides. In principle, such phenomenon as "seam" is unavoidable even in the case of the ALD (Atomic Layer Deposition) method with 100% level difference coverage. JP-A No. 2006-80291 (Patent Document 1) discloses the substrate processing device with respect to the ALD method to cope with the miniaturization technology.

In order to cope with the opening inside the trench sealed by the over-hang, the HDP (High Density Plasma) CVD method may be employed to conduct the ion etching with inert gas such as argon after forming the film to restore the opening of the trench by scratching the over-hang formed during the film formation. However, it is still difficult for the aforementioned method to fill the insulating film deep in the trench without forming the void if the trench width is 65 nm or less, and the aspect ratio is 5 or higher.

Accompanied with miniaturization of the element as described above, the interval between the electrodes of the respective elements has been reduced. Generally, in the semiconductor device such as the IC, an interlayer insulating film so called PMD (PreMetal Dielectric) film is formed between the element electrode such as the transistor, the resistance and the capacitor formed on the semiconductor substrate, and the metal wiring formed above the element electrode. The PMD film not only insulates between the element electrode and the metal wiring as the upper layer of the element electrode, but also fills the space between the element electrodes on the semiconductor substrate so as to planarize the respective layers.

Generally, the method where the silicon oxide film which contains impurities such as boron or phosphorus is deposited through the CVD method, and the insulating film is subjected to re-flow by heating to fill the PMD film between the element electrodes, or the HDP-TEOS method where deposition of the silicon oxide film and the sputter etching are performed simultaneously to fill the PMD film between the element electrodes have been employed. However, the aforementioned film forming process no longer allows the insulating film to be filled in a considerably small space between the element electrodes without forming the void and the seam therebetween.

The reason for the difficulty is that, likewise the element isolation trench as described above, the over-hang occurs in the opening between the electrodes to generate the void between the elements. In order to solve the aforementioned problem, the filling technology with the SOD (Spin on Dielectric) method for forming the insulating film has been developed by spin coating the application film of overhydro-genate silazane polymer solution (PSZ: Polysilazane) so as to be deposited between the elements, and thereafter by promoting the oxidation/polymerization through high-temperature steam oxidation.

The high-temperature steam oxidation process is likely to deteriorate reliability of the tunnel insulating film which has been already formed. For this, the temperature and the quantity of the steam under the steam oxidation process are desired to be optimized. Such optimization, however, cannot be made easily. If the steam oxidation condition (temperature and the like) is excessively loosened, the oxidation of the PSZ film cannot be advanced sufficiently in the very small space between the electrodes, thus lowering the pressure resistance between the elements to deteriorate the reliability.

SUMMARY OF THE INVENTION

It is an object of the present invention to provide a method and an apparatus of manufacturing the semiconductor device, which is capable of filling the insulating film in the element isolation trench with high aspect ratio and small width or filling the insulating film in the small gap between the element electrodes.

As one of the representative features of the present invention, a manufacturing method of a semiconductor device includes the steps of carrying a substrate in a processing chamber, supplying a silicon compound gas which contains carbon and hydrogen into the processing chamber to be brought into a state at a first pressure, forming a silicon oxide film on the substrate by irradiating a UV light to the silicon compound gas supplied into the processing chamber in the state kept at the first pressure, and decompressing the processing chamber into a state at a second pressure lower than the first pressure.

With the method of manufacturing the semiconductor device, the dense silicon oxide film may be formed in the trench with the high aspect ratio and small width.

BRIEF DESCRIPTION OF THE DRAWINGS

FIGS. 3A to 3D show process steps according to a second embodiment of the present invention;

DETAILED DESCRIPTION OF THE INVENTION

Figure 1:
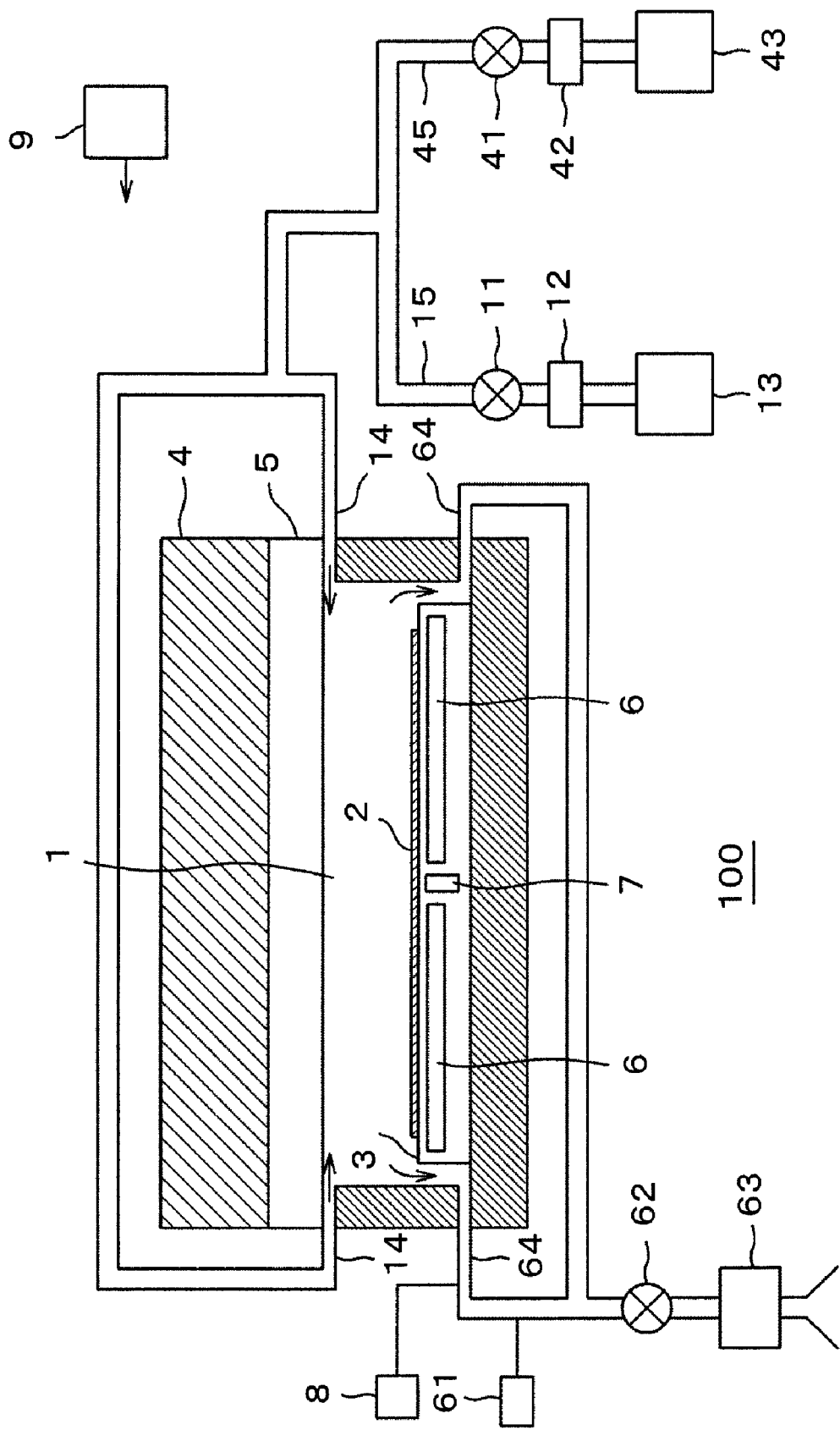
FIG. 1 shows an example of a structure of a semiconductor manufacturing apparatus (vertical sectional view), which allows the method of manufacturing the semiconductor device according to the present invention to be conducted.

An example of a structure of a semiconductor manufacturing apparatus which allows the method of manufacturing the semiconductor device according to the present invention to be conducted will be described referring to FIG. 1. FIG. 1 is a vertical sectional view of a semiconductor manufacturing apparatus 100 which allows a method of manufacturing the semiconductor device according to the present invention to be conducted. FIG. 1 shows a substrate processing chamber 1 for processing the substrate therein, that is, the substrate processing chamber for executing a step of manufacturing the semiconductor device according to the present invention, and a substrate 2 to be processed, on which the IC is formed. The substrate 2 is mounted on a susceptor 3 (substrate mount portion) so as to be processed. An emission unit 4 emits the UV light. In the embodiment, a quartz is used for forming a transmitting window 5 which transmits the UV light emitted from the emission unit 4 into the processing chamber 1. In the embodiment, a resistance heater is used for forming a heater unit 6 for heating the substrate 2. A temperature detector 7 detects a temperature of the substrate 2. A residual gas meter 8 measures the residual amount of the organic substance (carbon, hydrogen). A control unit 9 controls the pressure and the like in the processing chamber 1. The heater unit 6 and the temperature detector 7 are electrically coupled with the control unit 9. The control unit 9 controls electricity applied to the heater unit 6 based on the temperature information detected by the temperature detector 7 such that the temperature of the substrate 2 forms the desired temperature distribution at the desired timing.

In the semiconductor manufacturing apparatus 100, the emission unit 4 contains an excimer lamp, and is sealed with the noble gas such as argon ($Ar_2$), krypton ($Kr_2$), and xenon ($Xe_2$). The noble gas is sealed to set the wavelength of the UV light. For example, if $Ar_2$, $Kr_2$, or $Xe_2$ is sealed, the corresponding UV light may be generated at each wavelength of 126 nm, 146 nm, or 172 nm, respectively. In the embodiment, the UV light is generated by sealing the $Xe_2$. The generated UV light is supplied into the substrate processing chamber 1 through the transmitting window 5 formed of the quartz.

In the present invention, the use of the vacuum UV light at the wavelength of 200 nm or smaller may decompose the silicon compound gas efficiently. If the wavelength is longer than 200 nm, the silicon compound cannot be efficiently decomposed.

The substrate processing chamber 1 is air-tightly isolated from the emission unit 4 by the quartz transmitting window 5. The noble gas in the emission unit 4 does not leak to the substrate processing chamber 1, and the silicon compound gas in the substrate processing chamber 1 does not flow into the emission unit 4.

Preferably, the distance between the inner surface of the transmitting window 5 (surface at the side of the substrate processing chamber 1) and the substrate 2 mounted on the susceptor 3 is in a range from 5 to 15 mm. If the distance is too small, the time for which the UV light is irradiated to the silicon compound gas is reduced. Accordingly, the silicon compound gas is unlikely to be activated, making the decomposition difficult. If the distance is too large, the silicon compound gas activated by the UV light is likely to lose activity.

The gas supply system for supplying the processing gas will be described. Referring to FIG. 1, a gas inlet pipe 14 of the processing chamber 1 is connected to a silicon compound gas supply pipe 15 and an inert gas supply pipe 45. The silicon compound gas supply pipe 15 is provided with a silicon compound gas supply source 13 for supplying the silicon compound gas, an MFC (mass flow controller) 12 as a flow control unit 12, and a switching valve 11 sequentially from the upstream side. The inert gas supply pipe 45 is provided with an inert gas supply source 43 for supplying the inert gas such as $N_2$ (nitrogen), an MFC 42, and a switching valve 41 sequentially from the upstream side.

The MFCs 12, 42, and the switching valves 11, 41 are electrically coupled with the control unit 9. The control unit 9 controls the MFCs 12, 42, and the switching valves 11, 41 such that the gas supplied into the processing chamber 1 becomes the one of the desired type at a desired timing, and the flow rate of the supplied gas becomes the desired value at the desired timing.

As the silicon compound gas, one of OMTS (octamethyltrisiloxane: $Si_2O_2(CH_3)_8$), TMCTS (tetramethylcyclotetrasiloxane: $[(CH_3)HSiO]_4$, HSQ (hydroxygen silsesquioxane) may be employed.

The silicon compound gas may be supplied into the processing chamber 1 together with the inert gas from the inert gas source 43 simultaneously as needed. As the inert gas, argon, helium, and nitrogen gas may be employed.

A gas exhaust system of the processing chamber 1 will be described. Referring to FIG. 1, a gas exhaust pipe 64 for exhausting the atmosphere in the processing chamber 1 is provided with a residual gas meter 8, a pressure sensor 61, an APC (Auto Pressure Controller) valve 62 as a pressure regulator valve, and a vacuum pump 63 as a vacuum exhaust device sequentially from the upstream side. The vacuum pump 63 evacuates the processing chamber 1 so as to set the predetermined pressure therein (vacuum level). The APC valve 62, the pressure sensor 61 and the residual gas meter 8 are electrically coupled with the control unit 9. The control unit 9 controls the opening of the APC valve 62 based on the pressure value detected by the pressure sensor 61 such that the pressure in the processing chamber 1 achieves the desired value at the desired timing. The control unit 9 allows the vacuum pump 63 to evacuate such that the residual gas concentration in the processing chamber 1 becomes the predetermined partial pressure or less.

The control unit 9 is provided with a not shown operation unit and an I/O unit for executing the temperature control, pressure control, flow control, mechanical drive control and the like based on the recipe (control sequence of the film forming process). The control unit 9 includes a CPU (Central Processing Unit) and a memory, which constitute the hardware structure.

First to third examples using the semiconductor manufacturing apparatus 100 shown in FIG. 1 will be described.

First Embodiment

A first embodiment according to the present invention will be described referring to FIGS. 2A to 2G each showing the process step of the first embodiment according to the present invention. In the first embodiment, the semiconductor manufacturing apparatus 100 shown in FIG. 1 is used to fill the silicon oxide film into the trench (groove) formed in the element isolation region on the silicon substrate through the vacuum UV CVD method.

(A1) Step of Forming Trench

Figure 2A:
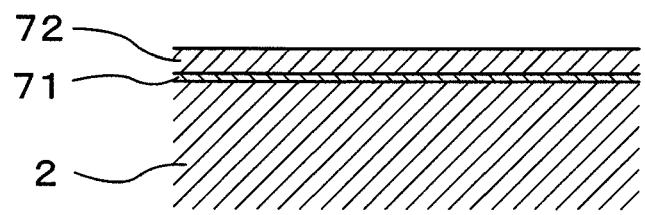
FIGS. 2A to 2G show process steps according to a first embodiment of the present invention.

The element isolation trench is formed in the element isolation region on the silicon substrate to a desired depth through the STI method. Firstly, as shown in FIG. 2A, a silicon oxide film ($SiO_2$) 71 is formed on the surface of a silicon substrate 2 using a known thermal oxidation method to have a film thickness of approximately 5 nm. A silicon nitride film (SiN) 72 is deposited on the silicon oxide film using the known decompression CVD method to have the film thickness of approximately 200 nm. The silicon nitride film 72 is used as an anti-etching mask when the element isolation trench is formed in the silicon substrate.

Figure 2B:
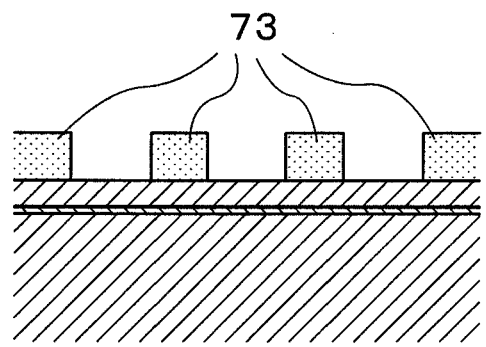
Figure 2C:
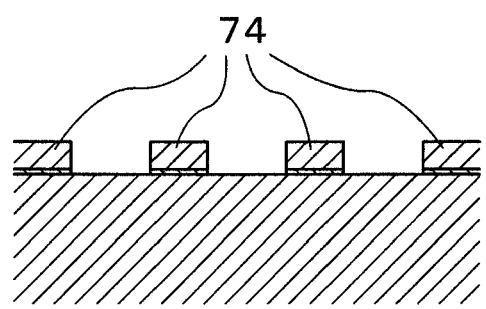
Figure 2D:
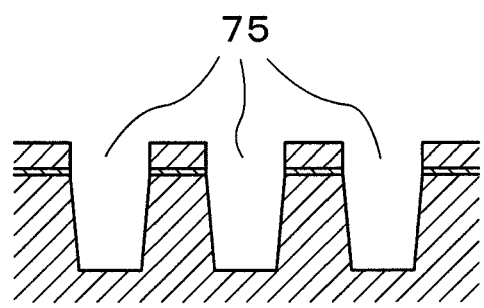

Referring to FIG. 2B, a resist pattern 73 is formed in a lithography step. Referring to FIG. 2C, the silicon nitride film 72 and the silicon oxide film 71 are selectively etched in the RIE (Reactive Ion Etching) step to form an anti-etching mask 74 to be used for forming the element isolation trench. In the aforementioned state, the silicon substrate 2 is etched in the RIE step to form an element isolation trench 75 as shown in FIG. 2D.

(B1) Step of Forming Silicon Oxide Film

After the step of forming the trench (A1), the thermal oxidation process is conducted using the known thermal oxidation method to form the silicon oxide film (not shown) on the inner surface of the element isolation trench. As described above, the anti-etching mask 74 for forming the element isolation trench contains the silicon nitride film 72. The interface adherence between the silicon nitride film 72 and the silicon oxide film formed through the vacuum UV CVD process is not in a good state. It is preferable to form the silicon oxide film after forming the element isolation trench 75 through the thermal oxidation process other than the vacuum UV CVD process on the inner surface of the element isolation trench 75 and the surface of the silicon nitride film 72 prior to the vacuum UV CVD processing as described below. This may improve the interface adherence with respect to the silicon oxide film formed through the vacuum UV CVD process. The thermal oxidation process step does not have to be necessarily conducted, and such step may be omitted arbitrarily.

(C1) Carry-In Step of Substrate

The substrate 2 having the element isolation trench 75 formed therein is mounted on the susceptor 3 in the substrate processing chamber 1 from a substrate inlet (not shown). Then the vacuum pump 63 evacuates the substrate processing chamber 1 via the exhaust pipe 64 to a predetermined vacuum level (for example, 20 Pa), and the heater unit 6 heats the substrate 2 to a predetermined temperature (for example, 80° C.).

(D1) Step of Forming Film

Figure 2E:
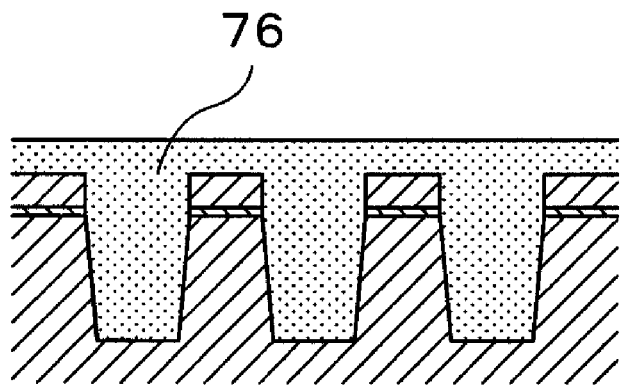

Referring to FIG. 2E, a silicon oxide film 76 is formed on the substrate using the vacuum UV CVD process. The step will be described in more detail hereinafter.

In the step of forming the film, a predetermined material gas (silicon compound gas) is supplied to the substrate processing chamber 1 from the silicon compound gas supply source 13 via the gas inlet pipe 14. At this time, the inert gas such as nitrogen gas may be supplied to the processing chamber 1 from the inert gas supply source 43 simultaneously. In the embodiment, the inert gas is not supplied. In the state where the material gas is supplied into the substrate processing chamber 1, the vacuum pump 63 regulates the inner pressure of the substrate processing chamber 1 into the predetermined value, and the UV light is irradiated from the emission unit 4 toward the material gas.

The organic silicon as the material gas contains Si—O—Si—R bond (R: lower alkyl group). In the embodiment, polysiloxane is used for forming the silicon compound gas as the material gas. Irradiation of the UV light decomposes the Si—O—Si—R bond of polysiloxane, that is, decomposes R to form siloxane (Si—O bond), and excites the siloxane for polymerization to form the silicon oxide film which contains the siloxane (Si—O bond). Preferably, the intensity of the UV light to be irradiated is set to be equal to or higher than 3 $mW/cm^2$, and equal to or lower than 100 $mW/cm^2$ on the surface of the substrate 2. The intensity of the UV light set to 3 $mW/cm^2$ or higher may increase the film forming rate, and makes it possible to keep the high flowability of the film during formation of the film. In the embodiment, the intensity is set to 50 $mW/cm^2$.

The higher the intensity of the UV light becomes, the higher the flowability of the film becomes. As the pressure of the material gas becomes higher, the amount of molecules of the material gas to be decomposed becomes large, thus making the flowability of the film higher.

The flowability of the film represents movability of the reaction product adhered onto the substrate. The reaction product adhered to the substrate is likely to move toward the position on the substrate so as to have the smaller density and planarized under the interfacial tension. Accordingly, the high flowability of the film allows the film to reach the bottom of the trench.

In the film forming step, it is preferable to set the temperature of the substrate 2 to be in the range from 0° C. to 100° C., and the pressure in the substrate processing chamber 1 to be in the range from 20 Pa to 100 Pa. If the pressure is lower than 20 Pa, the film forming rate is too low to be practical. In such a case, the density of the reaction product adhered to the substrate is small, resulting in the low flowability of the film. Meanwhile, if the pressure is higher than 100 Pa, the energy per molecule of the material gas is small, resulting in difficulty in the gas decomposition.

In the aforementioned example, the UV light is irradiated while supplying the material gas into the substrate processing chamber 1. However, the UV light may be irradiated in the state where supply of the material gas which has been applied into the substrate processing chamber 1 is stopped.

(E1) Step of Decompression Process

Figure 2F:
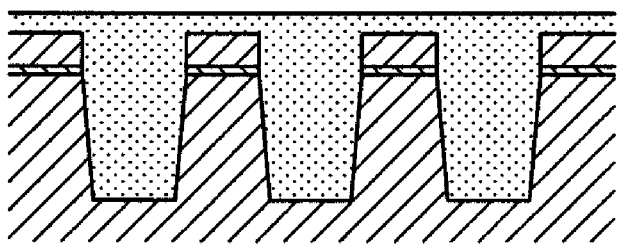

Referring to FIG. 2F, the silicon oxide film 76 deposited in the film forming step is decompressed to be dense with low concentration of the residual organic substance contained therein. In the decompression process, the supply of the material gas and irradiation of the UV light are stopped, and then the atmosphere in the substrate processing chamber 1 is exhausted. This may reduce the pressure in the substrate processing chamber 1 to be lower than the pressure for forming the film in the film forming step (D1). Accordingly, the dense film may be formed by lowering the concentration of the residual organic substance contained in the silicon oxide film 76.

Preferably, the decompression process is performed within approximately 30 seconds subsequent to the film forming step (D1) at the pressure equal to or lower than 0.1 Pa. The decompression process immediately after stopping irradiation of the vacuum UV light makes it possible to process the decomposed silicon compound. Within approximately 30 seconds after stopping irradiation of the vacuum UV light, the silicon compound is in the decomposed state, that is, in the state of the high flowability of the film. So the silicon oxide film or the insulating film may be easily formed in the element isolation trench. If excessive time elapses after stopping irradiation of the vacuum UV light until the decompression process, the decomposed silicon compound is partially combined again, thus losing the flowability of the film. In such a case, it is difficult to form the silicon oxide film or the insulating film in the element isolation trench. It is therefore preferable to conduct the decompression process while the desired flowability of the silicon compound irradiated with the vacuum UV light is available. If the decompression process is conducted immediately after stopping irradiation of the vacuum UV light, irradiation of the vacuum UV light may be stopped before the decompression process. This makes it possible to prolong the life of the lamp for emitting the vacuum UV light.

In the decompression process, the UV light may be irradiated to the material gas. In the above case, the silicon compound gas adhered onto the substrate is decomposed by the UV light in the decompression process step to enhance the flowability of the film, thus facilitating formation of the silicon oxide film or the insulating film in the element isolation trench.

The decompression process may be performed without stopping the supply of the material gas. In such a case, the pressure in the substrate processing chamber 1 is required to be lower than the pressure in the film forming step (D1). For this, the quantity of gas supplied into the substrate processing chamber 1 is reduced to be smaller than the one in the film forming step (D1), or the quantity of gas exhausted from the substrate processing chamber 1 is increased to be larger than the one in the film forming step (D1).

Under the film forming condition with the high flowability of the film (at relatively high pressure), the concentration of the residual organic substance (concentration of carbon or hydrogen) contained in the generated silicon oxide film is high. The residual organic substance is eliminated during the subsequent step, thus causing the void. The control unit 9 is capable of controlling to conduct the film forming/decompression process step (M), that is, conducting the film forming process and the decompression process alternately instead of conducting the aforementioned film forming step (D1) for the purpose of lowering the concentration of the residual organic substance contained in the silicon oxide film. If the film forming/decompression process step (M) is conducted, the decompression process step (E1) may be omitted.

(M) Film Forming/Decompression Process Step (M1) The film with the thickness in the range from approximately 1 to 2 nm is formed at the predetermined substrate temperature (from 0° C. to 100° C.) at the pressure of 10 Pa or less which is equal to or lower than the flow limit, that is, the low pressure with substantially no flowability of the film while supplying the material gas and irradiating the UV light. In the aforementioned process, as the energy per molecule of the material gas is large, the adherence with respective to the silicon of the substrate 2 is high. This makes it possible to form the film with high heat resistance at the low concentration of the residual organic substance.

(M2) The film is formed to have the desired thickness, that is, approximately ¼ of the trench width at the predetermined pressure (20 Pa to 100 Pa) for achieving the high film forming rate, and at the predetermined substrate temperature (0° C. to 100° C.) while supplying the material gas and irradiating the UV light.

(M3) The supply of the material gas and irradiation of the UV light are stopped and then the atmosphere in the substrate processing chamber 1 is exhausted such that the pressure in the substrate processing chamber 1 becomes lower than the pressure in the film forming step (M2). This may lower the concentration of the residual organic substance contained in the film, resulting in the dense film. The step (M3) corresponds to the decompression process step (E1). Preferably, the exhaust is performed while monitoring the residual gas meter 8 until the partial pressure of the organic substance during the exhaust becomes the predetermined value. The predetermined partial pressure is experimentally set to an appropriate value in advance. Alternatively, the time period taken for the partial pressure of the organic substance during the exhaust to become the predetermined value is preliminarily measured, based on which the atmosphere is exhausted.

(M4) After exhausting the atmosphere in the substrate processing chamber 1, the material gas is supplied such that the pressure and the temperature in the substrate processing chamber 1 reach the values ranging from 20 Pa to 100 Pa, and 0° C. to 100°, respectively. Thereafter, the UV light is irradiated to the material gas from the emission unit 4. In this way, the film is formed to have the thickness corresponding to approximately ¾ of the trench width.

(M5) Likewise the step (M3), the supply of the material gas and irradiation of the UV light are stopped, and then the atmosphere in the substrate processing chamber 1 is exhausted. The exhaust is finished when the partial pressure of the organic substance during the exhaust becomes the predetermined value.

(M6) After exhausting the atmosphere in the substrate processing chamber 1, the material gas is supplied. After the pressure and the temperature in the substrate processing chamber 1 reach the predetermined values ranging from 20 Pa to 100 Pa, and 0° C. to 100° C., respectively, the UV light is irradiated to the material gas from the emission unit 4. The film is formed until the thickness reaches the predetermined value, that is, the inside of the trench is completely filled.

The film forming and exhausting operations are repeatedly performed as in the steps from (M2) to (M6) so as to form the flat insulating film which contains less organic substance deep in the trench.

Each value of the pressure and temperature described in the respective steps of (M2), (M4) and (M6) may be the same. Alternatively, those values may be different in case of necessity. For example, the pressure values in the respective steps of (M2), (M4) and (M6) may be set to be in the ranges from 20 to 30 Pa, 30 to 40 Pa, and 40 to 100 Pa, respectively. In such a case, the flowability of the film in the step (M4) becomes higher than the step (M2), and the flowability of the film in the step (M6) becomes higher than the step (M4). In the step (M4) having the trench width smaller than the step (M2), or in the step (M6) having the trench width smaller than the step (M4), the insulating film may be formed in the trench more easily.

The decompression process likewise the step (M3) may be performed between the steps (M1) and (M2). As the film is formed in the step (M1) at the pressure lower than the step (M2) to have the thickness smaller than the step (M2), the decompression immediately after the step (M1) is not necessarily required.

(F1) Substrate Carry-Out Step

After forming the desired insulating film, the inert gas such as nitrogen gas is supplied from the inert gas supply source 43 to the processing chamber 1. The inert gas substitutes the atmosphere in the substrate processing chamber 1. After the atmospheric pressure is restored, the processed substrate 2 is carried out from the processing chamber 1.

(G1) Thermal Processing Step

The substrate 2 is subjected to a thermal processing at the temperature higher than the one in the film forming step (D1) in the oxidation atmosphere such as oxygen or in the inert atmosphere in a known heating device separately from the semiconductor manufacturing apparatus 100 as shown in FIG. 1. Then the density of the organic substance contained in the silicon oxide film 76 is lowered to densify the silicon oxide film 76. It is preferable to conduct the thermal processing for densification at the temperature ranging from 700° C. to 1100° C. The higher thermal processing temperature is expected to provide better results. However, the temperature is limited by the product obtained in the step prior to the one of filling the element isolation trench. For example, in a third embodiment to be described later where the electrode is formed in the previous step, if it is heated at the high temperature equal to or higher than 700° C., the electrode quality may be altered. In the aforementioned case, heating has to be conducted at the temperature so as not to adversely influence the quality of the electrode.

In the embodiment, the heating process is conducted in the heating device separately from the semiconductor manufacturing apparatus 100. However, it is not limited to the aforementioned structure. The heating may be conducted by a heater 6 of the substrate mount portion 3 in the substrate processing chamber 1 prior to the substrate carry-out step (F1). Heating in the semiconductor manufacturing apparatus 100 requires substantially the long time. Accordingly, it is preferable to conduct the heating in the separate heating device so as to improve the throughput.

(H1) CMP Step

Figure 2G:
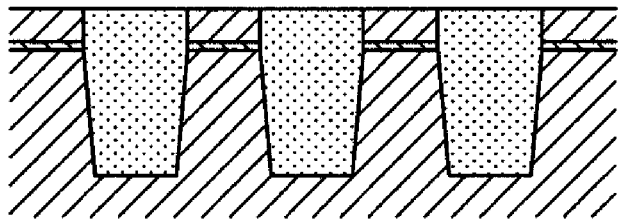

After densifying the silicon oxide film, the unnecessary silicon oxide film on the substrate is removed through the CMP (Chemical Mechanical Polishing) process to planarize the surface of the substrate 2 as shown in FIG. 2G.

Second Embodiment

A second embodiment will be described referring to FIGS. 3A to 3D showing the process steps according to the present invention. Likewise the first embodiment, in the second embodiment, the silicon oxide film is filled into the trench formed in the element isolation region on the silicon substrate through the vacuum UV CVD method. Unlike the first embodiment, in the second embodiment, the silicon oxide film is filled in the part of the element isolation trench through the vacuum UV CVD method.

In the second embodiment, the following steps are conducted sequentially in the order of trench forming step (A2), silicon oxide film forming step (B2), substrate carry-in step (C2), film forming step (D2), decompression process step (E2), substrate carry-out step (F2), plasma CVD process step (P), thermal process step (G2), and CMP step (H2). The respective steps except the film forming step (D2) and the plasma CVD process step (P) are the same as those conducted in the first embodiment, and explanations thereof, thus will be omitted.

In the film forming step (D2), the silicon oxide film is deposited and filled in the element isolation trench under the vacuum UV CVD method (material gas type, pressure, temperature and the like) likewise the film forming step (D1) according to the first embodiment. In the film forming step (D2), a surface 81 of the silicon oxide film 76 deposited in the element isolation trench through the vacuum UV CVD method is at the height lower than a surface 83 of an element portion 82 as shown in FIG. 3A. As a result, the concavo-convex portion is formed on the surface of the substrate 2. Referring to FIG. 3A, the silicon oxide film 76 is formed in the element isolation trench to the position corresponding to the lower end of the silicon oxide film 71 below the silicon nitride film 72 of the element portion 82, that is, the surface of the silicon portion of the substrate 2.

After conducting the film forming step (D2), the decompression process step (E2) is conducted as shown in FIG. 3B to decompress the silicon oxide film 76 deposited by the vacuum UV CVD process to form the dense silicon oxide film.

Thereafter, in the plasma CVD process step (P), the known plasma CVD process is conducted to deposit the silicon oxide film 85 until the height of the surface 84 of the silicon oxide film deposited in the element isolation trench becomes higher than the surface 83 of the element portion 82. Preferably the plasma CVD process conducted at this time is in the form of HDP-CVD process using the high density plasma (HDP). This is because the density of the silicon oxide film 85 deposited by the HDP-CVD process is high, and the etching rate is substantially the same as that of the silicon nitride film 72 to form the etching stopper layer. In the plasma CVD process step (P), the known thermal CVD process may be conducted instead of the plasma CVD process. The known thermal CVD process allows the silicon oxide film 85 with the density higher than the one formed through the vacuum UV CVD process.

In the substrate carry-out step (F2), after carrying out the substrate 2 from the substrate processing chamber 1, it is subjected to the thermal processing under the oxidation atmosphere such as oxygen or the inert atmosphere in the thermal process step (G2) to densify the silicon oxide film 76.

Figure 3C:
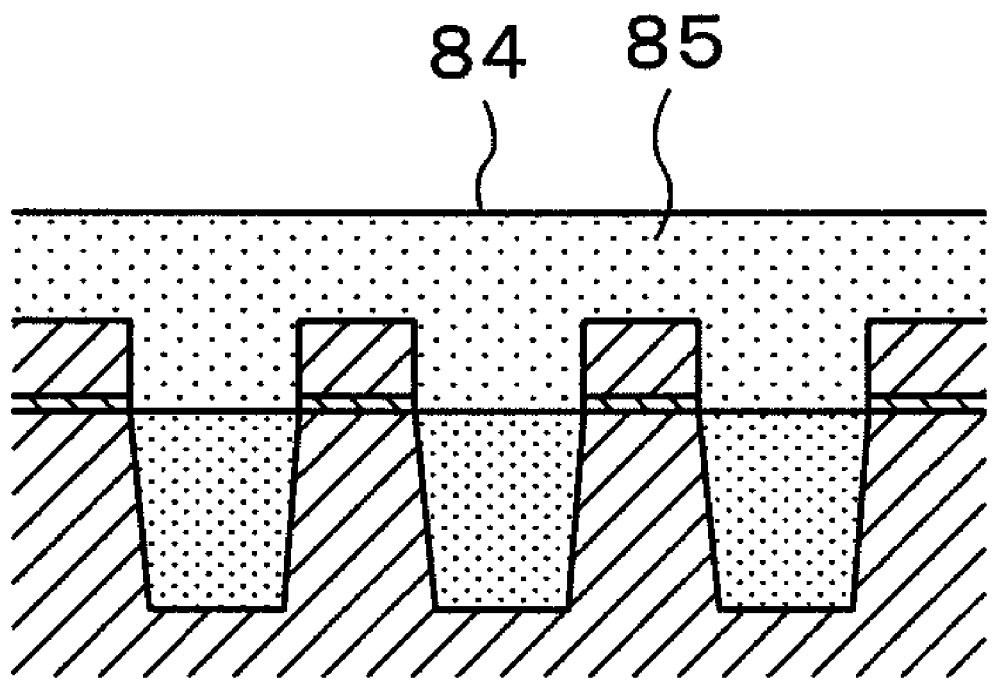
Figure 3D:
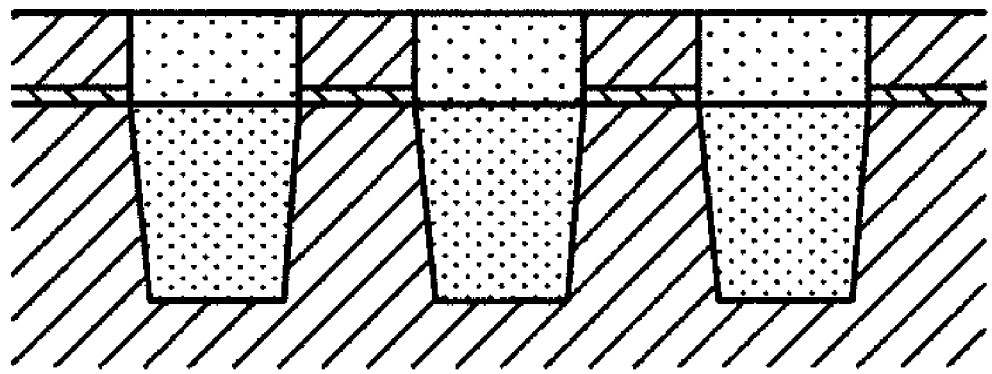

Thereafter, in the CMP step (H2), the unnecessary silicon oxide film 85 on the substrate is removed as shown in FIG. 3D.

The silicon oxide film 76 formed through the vacuum UV CVD process contains more organic substance, and accordingly has the low film density compared with the silicon nitride film 72 and the silicon oxide film 85 formed through the plasma CVD process or the thermal CVD process. The etching rate for the silicon oxide film 76 through the vacuum UV CVD process is higher than that for the silicon nitride film 72 for forming the etching stopper layer. The etching rate for the silicon oxide film 85 formed through the plasma CVD process or the thermal CVD process is approximately the same as that for the silicon nitride film 72 for forming the etching stopper layer. When etching the substrate which contains the mixture of the silicon oxide film 76 formed through the vacuum UV CVD process and the silicon nitride film 72, degradation in the configuration of the substrate owing to the etching rate difference, that is, the concavo-convex portion is likely to occur on the surface of the substrate 2. Conversely, when etching the substrate which contains the mixture of the silicon oxide film 85 formed through the plasma CVD process or the thermal CVD process and the silicon nitride film 72, degradation in the configuration of the substrate is unlikely to occur.

In the second embodiment, the step of filling the element isolation trench requires deposition of the silicon oxide film 76 through the vacuum UV CVD process, and the silicon oxide film 85 through the plasma CVD process or the thermal CVD process, thus increasing the number of steps. In the CMP process (H2), however, the silicon oxide film in the element isolation trench to be removed is formed into the deposited silicon oxide film 85 in the plasma CVD process step (P). At the end of the element isolation trench filling step, the difference of the etching rate between the silicon nitride film 72 of the element portion and the silicon oxide film 85 filled in the element isolation trench is reduced when conducting the wet etching for removing the silicon nitride film 72 and the silicon oxide film 85, thus suppressing degradation (concavo-convex) in the surface of the substrate owing to the etching rate difference.

Third Embodiment

In a third embodiment, a silicon oxide film is filled between the element electrodes such as transistors formed on the semiconductor substrate as an interlayer insulating film (PMD film) through the vacuum UV CVD method.

The third embodiment will be described referring to FIGS. 4A to 4F. FIGS. 4A to 4F show the process steps according to the third embodiment of the present invention. In the third embodiment, steps of (J) forming electrodes, (K) forming a side wall, (B3) forming silicon oxide film, (C3) substrate carry-in, (D3) forming the film, (E3) decompression process, (F3) substrate carry-out, (G3) thermal processing, and (H3) CMP are sequentially conducted. The respective steps except the steps of forming the electrode (J) and forming the side wall (K) are the same as those of the first embodiment, and explanations thereof, thus will be omitted.

Figure 4A:
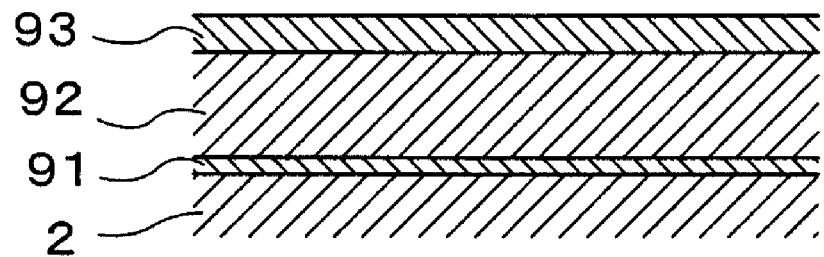
FIGS. 4A to 4F show process steps according to a third embodiment of the present invention.

(J) In the step of forming the electrode, a gate insulating film ($SiO_2$) 91 is formed on the surface of the silicon substrate 2 as shown in FIG. 4A through the known thermal oxidation method so as to have the film thickness of approximately 8 nm or smaller. A poly silicon film is formed on the resultant surface as a gate electrode film 92 so as to have the thickness of approximately 100 nm. The laminated film using WSi (tungsten silicide), CoSi (cobalt silicide) and the like may be used for forming the electrode film 92. In such a case, the film thickness is in the range from 100 to 200 nm. Thereafter, a silicon nitride film (SiN) 93 is further formed on the resultant surface.

Figure 4B:
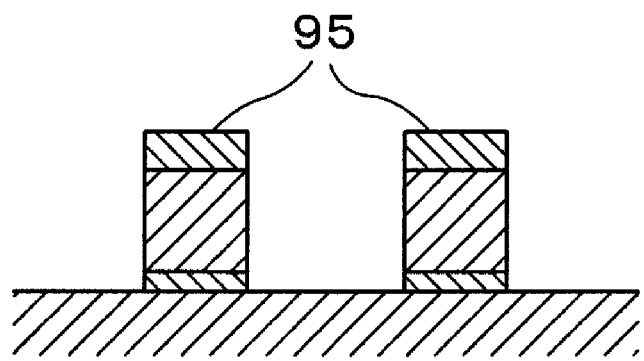

The resist pattern is formed in the lithography step to etch the silicon nitride film 92 and the gate electrode film 92 in the RIE step to form the gate electrode 95 as shown in FIG. 4B.

Figure 4C:
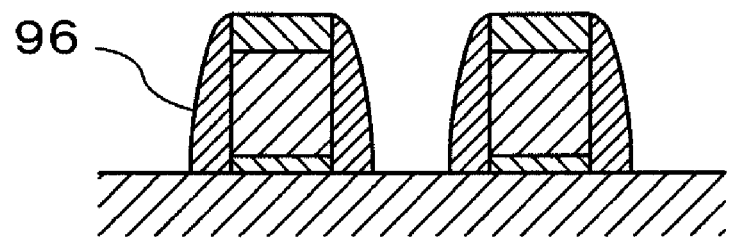

In the step of forming the side wall (K), a silicon nitride film (SiN) is formed on the entire surface of the silicon substrate through the known thermal CVD method as shown in FIG. 4C, for example. Thereafter, a side wall film (SiN) 96 is formed on the side wall of the electrode through the known etch back step.

Figure 4D:
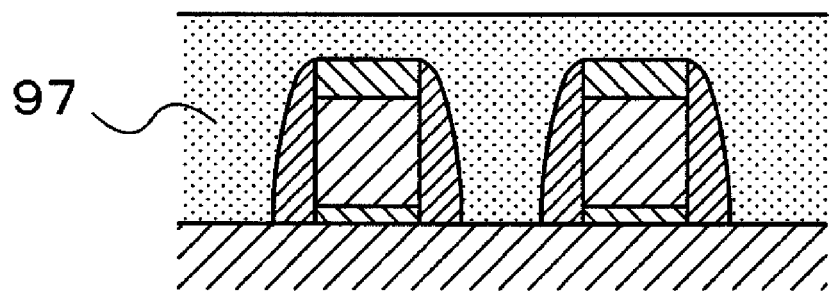

Then in the step of substrate carry-in (C3), the substrate 2 is carried in the processing chamber 1, the silicon oxide film 97 is formed on the substrate 2 through the vacuum UV CVD process using the apparatus 100 shown in FIG. 1 in the step of forming the film (D3) as shown in FIG. 4D. Likewise the first embodiment, the step of forming the silicon oxide film (B3) may be conducted prior to the step of substrate carry-in (C3) so as to form the silicon oxide film preliminarily on the silicon nitride film as the side wall film.

Figure 4E:
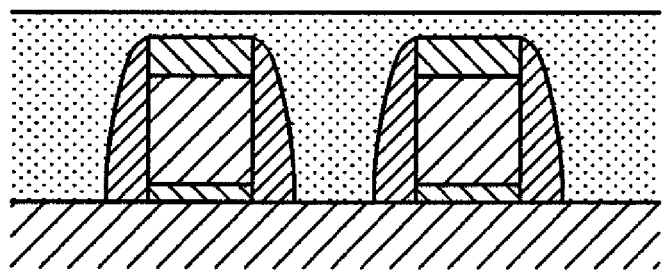

In the decompression step (E3), the inside of the processing chamber 1 is decompressed so as to allow the silicon oxide film 97 deposited through the vacuum UV CVD process to be dense) as shown in FIG. 4E.

After the decompression process step (E3), the processed substrate 2 is carried out from the substrate processing chamber 1 in the substrate carry-out step (F3).

After carrying out the substrate 2 from the substrate processing chamber 1, the thermal process is conducted under the oxidation atmosphere such as oxygen, or the inert atmosphere such as nitrogen in the thermal process step (G3) using the known heating device. It is preferable to conduct the thermal process at the temperature ranging from 300 to 600 C so as not to alter the electrode quality. The thermal process further densifies the silicon oxide film 97.

Figure 4F:
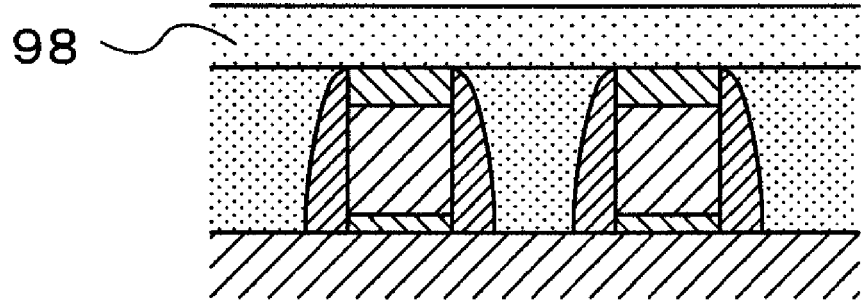

After conducting the thermal process step (G3), the silicon oxide film 97 is planarized through the CMP process in the CMP process step (H3) as shown in FIG. 4F. Thereafter, the silicon oxide film 98 is deposited through the known plasma CVD method and the like, on which a second gate electrode is formed.

The silicon oxide film deposited by exciting the polysiloxane through the vacuum UV CVD process contains the Si—R bond (R: lower alkyl group), and accordingly, has the lower film density compared with the generally employed silicon dioxide. The relative permittivity of the general silicon dioxide is approximately 4.0. The silicon oxide film deposited through the vacuum UV CVD method becomes the insulating film with low permittivity in the range from 2.6 to 3.8. This may improve the signal delay by reducing the insulating capacity between the electrodes in the third embodiment of the present invention, thus further improving the operation speed of the active device.

Figure 5:
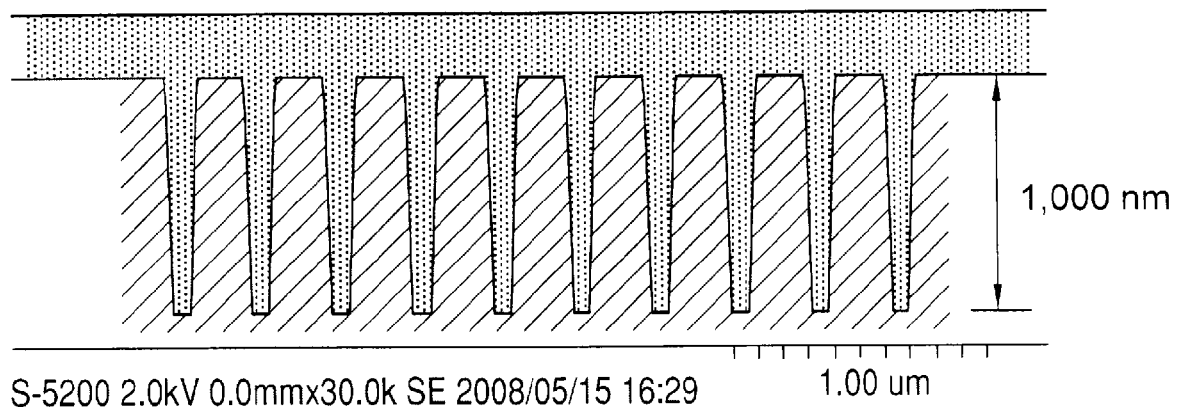
FIG. 5 is a diagram showing an example where the silicon oxide film is filled in the element isolation trench according to the present invention.

FIG. 5 shows an example of the vacuum UV CVD process, having the silicon oxide film filled in the element isolation trench according to the first embodiment. Referring to FIG. 5, the silicon oxide film is formed in the element isolation trench with the depth of approximately 1000 nm, and the width of approximately 100 nm without generating the void or the seam. According to the present invention, the silicon oxide film may be filled in the element isolation trench with small width without generating the void or seam.

Having been described with respect to the present invention, a method of manufacturing a semiconductor device according to the invention includes the steps of carrying a substrate in a processing chamber, supplying a silicon compound gas which contains carbon and hydrogen into the processing chamber to be brought into a state at a first pressure, forming a silicon oxide film on the substrate by irradiating a UV light to the silicon compound gas supplied into the processing chamber in the state kept at the first pressure, stopping a supply of the silicon compound gas into the processing chamber, and decompressing the processing chamber into a state at a second pressure lower than the first pressure while stopping a supply of the silicon compound gas into the processing chamber.

The method allows the dense silicon oxide film to be formed in the trench with the high aspect ratio and small width, and may be designed not to stop supplying the silicon compound gas into the processing chamber in the decompression process step.

A method of manufacturing a semiconductor device according to the invention includes the steps of carrying a substrate having an element isolation trench for separating elements in a processing chamber, supplying a silicon compound gas which contains carbon and hydrogen into the processing chamber to be brought into a state at a first pressure, forming an insulating film in the element isolation trench by irradiating a UV light into the processing chamber in the state kept at the first pressure, stopping a supply of the silicon compound gas into the processing chamber, and decompressing the processing chamber into a state at a second pressure lower than the first pressure while stopping a supply of the silicon compound gas into the processing chamber.

The method allows the dense insulating film to be formed in the trench with the high aspect ratio and small width, and may be designed not to stop supplying the silicon compound gas into the processing chamber in the decompression process step.

In the aforementioned method, a silicon nitride film is formed on a surface of an element forming portion adjacent to the element isolation trench. The insulating film is formed in the element isolation trench at a position with a height lower than a surface of the silicon nitride film in the step of forming the insulating film and the step of decompression process, and the insulating film is further formed in the element isolation trench through a thermal CVD process or a plasma CVD process.

As the difference of the etching rate between the insulating film formed through the thermal CVD process or the plasma CVD process and the silicon nitride film is small, the method suppresses deterioration of the substrate surface (concavo-convex) caused by the difference of the etching rate when conducting the wet etching to the silicon nitride film in the subsequent step.

The method as described above further includes a thermal process step of thermally processing the substrate with the silicon oxide film at a temperature higher than the one in the step of forming the silicon oxide film after conducting the decompression process step.

The method allows the dense silicon oxide film to be formed in the trench with the high aspect ratio and small width.

In the method as described above, the UV light is irradiated into the processing chamber in the decompression process step.

The method allows the silicon compound gas adhered to the substrate to be decomposed by the UV light even in the decompression process step to easily form the silicon oxide film or the insulating film in the element isolation trench.

In the method as described above, the silicon compound gas is siloxane.

The method allows the silicon oxide film or the insulating film to be efficiently formed in the element isolation trench.

In the method as described above, the silicon compound gas is OMCTS.

The method allows the silicon oxide film or the insulating film to be efficiently formed in the element isolation trench.

A method of manufacturing a semiconductor device includes the steps of carrying a substrate having an element isolation trench for separating elements in a processing chamber, performing a first insulating film forming step of forming an insulating film in the element isolation trench by supplying a silicon compound gas which contains carbon and hydrogen into the processing chamber, and irradiating a UV light into the processing chamber in a state kept at a first pressure, performing a first decompression process step of bringing the processing chamber into a state at a second pressure lower than the first pressure while stopping a supply of the silicon compound gas into the processing chamber, performing a second insulating film forming step of forming an insulating film in the element isolation trench by supplying the silicon compound gas into the processing chamber and irradiating the UV light into the processing chamber in a state kept at a third pressure, and performing a second decompression process step of bringing the processing chamber into a state at a fourth pressure lower than the third pressure while stopping the supply of the silicon compound gas into the processing chamber.

The method allows the insulating film with less impurity substance to be formed compared with the case where the insulating film forming step and the decompression process step are respectively conducted only once. The decompression process step may be designed not to stop supplying the silicon compound gas into the processing chamber.

In the method according to the present invention, the third pressure is higher than the first pressure.

With the aforementioned method, the insulating film with low flowability and less impurity substance is formed in the first insulating film forming step in the state where the trench width is relatively large. Meanwhile in the state where the trench width is relatively small, the insulating film with increased impurity substance yet high flowability may be formed in the second insulating film forming step. Accordingly, the dense insulating film may be formed in the trench with the high aspect ratio and small width.

A semiconductor manufacturing apparatus according to the present invention includes a processing chamber for processing a substrate, a processing gas supply unit for supplying a silicon compound gas which contains carbon and hydrogen into the processing chamber, a exhaust unit for exhausting an atmosphere in the processing chamber, a UV emission unit for irradiating the UV light into the processing chamber, and a control unit. The control unit supplies the silicon compound gas into the processing chamber from the processing gas supply unit in the state where the substrate with the element isolation trench is in the processing chamber, irradiates the UV light into the processing chamber to form an insulating film in the element isolation trench such that the processing chamber is brought into a state at a first pressure, and stops the supply of the silicon compound gas into the processing chamber such that the processing chamber is brought into a state at a second pressure lower than the first pressure.

The semiconductor manufacturing apparatus allows the dense silicon oxide film to be formed in the trench with the high aspect ratio and small width. The decompression process step may be designed not to stop supplying the silicon compound gas into the processing chamber.

A manufacturing method of a semiconductor device according to the present invention includes the steps of carrying a substrate in a processing chamber, supplying a silicon compound gas which contains carbon and hydrogen into the processing chamber to bring the processing chamber into a state at a first pressure, forming a silicon oxide film on the substrate by irradiating a UV light to the silicon compound gas supplied into the processing chamber when the processing chamber is in the state at the first pressure, decompressing the processing chamber into a state at a second pressure lower than the first pressure, and thermally processing the substrate having the silicon oxide film formed at a temperature higher than that in the step of forming the silicon oxide film.

The manufacturing method allows the dense silicon oxide film to be formed in the trench with the high aspect ratio and small width.

A manufacturing method of a semiconductor device according to the present invention includes the steps of forming an element isolation trench on a silicon substrate, forming a silicon oxide film in the element isolation trench, carrying the substrate having the element isolation trench in the processing chamber, supplying a silicon compound gas which contains carbon and hydrogen into the processing chamber to be brought into a state at a first pressure, forming an insulating film by irradiating a UV light into the processing chamber to form an insulating film in the element isolation trench while keeping the processing chamber in the state at the first pressure, and decompression process for bringing the processing chamber into the state at a second pressure lower than the first pressure.

The manufacturing method of the semiconductor device improves the interfacial adherence between the insulating film to be formed in the element isolation trench in the insulating film forming step, and the inner surface of the element isolation trench.

What is claimed is:

1. A manufacturing method of a semiconductor device comprising the steps of:
   carrying a substrate in a processing chamber;
   supplying a silicon compound gas which contains carbon and hydrogen into the processing chamber to be brought into a state at a first pressure;
   forming a silicon oxide film on the substrate by irradiating a UV light to the silicon compound gas supplied into the processing chamber in the state kept at the first pressure; and
   decompressing the processing chamber into a state at a second pressure lower than the first pressure while stopping a supply of the silicon compound gas into the processing chamber.

2. The manufacturing method of a semiconductor device according to claim 1, further comprising a thermal process step of thermally processing the substrate with the silicon oxide film at a temperature higher than the one in the step of forming the silicon oxide film after conducting the decompression process step.

3. The manufacturing method of a semiconductor device according to claim 1, wherein the UV light is irradiated into the processing chamber in the decompression process step.

4. The manufacturing method of a semiconductor device according to claim 1, wherein the silicon compound gas is siloxane.

5. The manufacturing method of a semiconductor device according to claim 1, wherein the silicon compound gas is OMCTS.

6. A manufacturing method of a semiconductor device comprising the steps of:
   carrying a substrate having an element isolation trench for separating elements in a processing chamber;
   supplying a silicon compound gas which contains carbon and hydrogen into the processing chamber to be brought into a state at a first pressure;
   forming an insulating film in the element isolation trench by irradiating a UV light into the processing chamber in the state kept at the first pressure; and
   decompressing the processing chamber into a state at a second pressure lower than the first pressure while stopping a supply of the silicon compound gas into the processing chamber.

7. The manufacturing method of a semiconductor device according to claim 6, wherein:
   a silicon nitride film is formed on a surface of an element forming portion adjacent to the element isolation trench; and
   the insulating film is formed in the element isolation trench at a position with a height lower than a surface of the silicon nitride film in the step of forming the insulating film and the step of decompression process, and the insulating film is further formed in the element isolation trench through a thermal CVD process or a plasma CVD process.

8. The manufacturing method of a semiconductor device according to claim 6, wherein the UV light is irradiated into the processing chamber in the decompression process step.

9. The manufacturing method of a semiconductor device according to claim 6, wherein the silicon compound gas is siloxane.

10. The manufacturing method of a semiconductor device according to claim 6, wherein the silicon compound gas is OMCTS.

11. A manufacturing method of a semiconductor device comprising the steps of:
    carrying a substrate having an element isolation trench for separating elements in a processing chamber;
    performing a first insulating film forming step of forming an insulating film in the element isolation trench by supplying a silicon compound gas which contains carbon and hydrogen into the processing chamber, and irradiating a UV light into the processing chamber in a state kept at a first pressure;
    performing a first decompression process step of bringing the processing chamber into a state at a second pressure lower than the first pressure while stopping a supply of the silicon compound gas into the processing chamber;
    performing a second insulating film forming step of forming an insulating film in the element isolation trench by supplying the silicon compound gas into the processing chamber and irradiating the UV light into the processing chamber in a state kept at a third pressure; and
    performing a second decompression process step of bringing the processing chamber into a state at a fourth pressure lower than the third pressure while stopping the supply of the silicon compound gas into the processing chamber.

12. The manufacturing method of a semiconductor device according to claim 11, wherein the third pressure is higher than the first pressure.

* * * * *